United States Patent
Lee et al.

(10) Patent No.: US 8,927,997 B2
(45) Date of Patent: Jan. 6, 2015

(54) SUBSTRATE INCLUDING THIN FILM TRANSISTORS AND ORGANIC LIGHT EMITTING DISPLAY APPARATUS INCLUDING THE SUBSTRATE

(75) Inventors: Won-Kyu Lee, Yongin (KR); Young-Jin Chang, Yongin (KR); Seong-Hyun Jin, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 73 days.

(21) Appl. No.: 13/539,097

(22) Filed: Jun. 29, 2012

(65) Prior Publication Data

US 2013/0175533 A1 Jul. 11, 2013

(30) Foreign Application Priority Data

Jan. 5, 2012 (KR) .......................... 10-2012-0001551

(51) Int. Cl.
*H01L 27/32* (2006.01)
*H01L 29/786* (2006.01)

(52) U.S. Cl.
USPC ................... 257/72; 257/57; 257/59; 257/66; 257/88; 257/89; 257/92; 438/151

(58) Field of Classification Search
USPC ......... 313/504; 257/57, 59, 66, 72, 88, 89, 92
See application file for complete search history.

(56) References Cited

U.S. PATENT DOCUMENTS

2010/0045173 A1* 2/2010 Kwon et al. ................... 313/504
2010/0052517 A1* 3/2010 Kim .............................. 313/504

FOREIGN PATENT DOCUMENTS

| KR | 10-2005-0112034 | 11/2005 |
|---|---|---|
| KR | 10-2007-0040035 | 4/2007 |
| KR | 10-2008-0086062 | 9/2008 |
| KR | 10-2010-0070082 | 6/2010 |

* cited by examiner

*Primary Examiner* — Matthew W Such
*Assistant Examiner* — David Spalla
(74) *Attorney, Agent, or Firm* — Robert E. Bushnell, Esq.

(57) ABSTRACT

A substrate includes a thin film transistor (TFT) which includes an active layer, a gate electrode, a source electrode, and a drain electrode; a first insulating layer disposed between the active layer and the gate electrode; a second insulating layer disposed between the gate electrode and the source and drain electrodes; a third insulating layer disposed on the second insulating layer, and including a first region for opening the second insulating layer and a second region for opening one of the source and drain electrodes, the first region and the second region being integrally connected; and a first electrode connected to one of the source and drain electrodes, and disposed so as to cover the first region and the second region.

20 Claims, 5 Drawing Sheets

SUBSTRATE INCLUDING THIN FILM TRANSISTORS AND ORGANIC LIGHT EMITTING DISPLAY APPARATUS INCLUDING THE SUBSTRATE

CLAIM OF PRIORITY

This application makes reference to, incorporates the same herein, and claims all benefits accruing under 35 U.S.C. §119 from an application earlier filed in the Korean Intellectual Property Office on the 5 Jan. 2012 and there duly assigned Serial No. 10-2012-0001551.

BACKGROUND OF THE INVENTION

1. Field of the Invention

The present invention relates to a substrate including thin film transistors (TFTs), and an organic light emitting display apparatus including the substrate, and more particularly, to an active-matrix (AM) bottom emission type organic light emitting display apparatus.

2. Description of the Related Art

Recently, display apparatuses have been replaced with portable, thin flat panel display apparatuses. Among the flat panel display apparatuses, electroluminescent display apparatuses are self-emissive display apparatuses that display an image by using light generated by recombination of electrons and holes in an emission layer (EML), and that have a wide viewing angle, an excellent contrast ratio, and a high response speed, and thus are regarded as next-generation display apparatuses.

In general, organic light emitting display apparatuses may be classified into a passive-matrix (PM) type organic light-emitting display apparatus and an active-matrix (AM) type organic light-emitting display apparatus according to the method of driving an organic light emitting diode (OLED).

Also, the organic light emitting display apparatuses may be classified into a top-emission type organic light emitting display apparatus in which an image is realized toward an encapsulation substrate, and a bottom-emission type organic light-emitting display apparatus in which an image is realized away from the encapsulation substrate.

In the AM type organic light emitting display apparatus, at least two thin film transistors (TFTs) and at least one capacitor are arranged in one pixel. However, in the bottom-emission type organic light emitting display apparatus, the TFTs and the capacitor should not be disposed in a direction in which light is emitted on a light emission path, and thus the bottom-emission type organic light emitting display apparatus may have a limit as to an aperture ratio.

SUMMARY OF THE INVENTION

The present invention provides a substrate including thin film transistors (TFTs) and an organic light emitting display apparatus including the substrate.

According to an aspect of the present invention, there is provided a substrate which includes a thin film transistor (TFT) including an active layer, a gate electrode, a source electrode, and a drain electrode; a first insulating layer disposed between the active layer and the gate electrode; a second insulating layer disposed between the gate electrode and the source and drain electrodes; a third insulating layer disposed on the second insulating layer, and including a first region for opening the second insulating layer and a second region for opening one of the source and drain electrodes, wherein the first region and the second region are integrally connected; and a first electrode connected to one of the source and drain electrodes, and disposed so as to cover the first region and the second region.

The first electrode may include transparent conductive oxide.

The transparent conductive oxide may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The source and drain electrodes may include a plurality of metal layers having different etch rates.

The second region may further include non-openings in which the third insulating layer exists, and which are on one of the source and drain electrodes.

The non-openings may be disposed in a repetitive pattern.

The first electrode may be disposed on the third insulating layer of the non-openings.

The second region may include an externally extended region of one of the source and drain electrodes connected to the first electrode, and the extended region and the TFT do not overlap with each other.

The second region may include an externally extended region of one of the source and drain electrodes connected to the first electrode.

The extended region and the TFT do not overlap with each other.

The third insulating layer may not be disposed in the extended region.

The first electrode may be disposed in the extended region.

The first electrode may further include a transflective metal layer.

The transflective metal layer may include at least one material selected from the group consisting of Ag, an Ag alloy, Al, and an Al alloy.

According to another aspect of the present invention, there is provided an organic light emitting display apparatus which includes a thin film transistor (TFT) including an active layer, a gate electrode, a source electrode, and a drain electrode; a first insulating layer disposed between the active layer and the gate electrode; a second insulating layer disposed between the gate electrode and the source and drain electrodes; a third insulating layer disposed on the second insulating layer, and including a first region for opening the second insulating layer and a second region for opening one of the source and drain electrodes, wherein the first region and the second region are integrally connected; a first electrode connected to one of the source and drain electrodes, and disposed to cover the first region and the second region; a second electrode facing the first electrode; and an organic emission layer (organic EML) disposed between the first electrode and the second electrode.

The first electrode may include transparent conductive oxide, and the second electrode may be a reflective electrode that reflects light emitted from the organic EML.

The first electrode may further include a transflective metal layer.

The second region may further include non-openings in which the third insulating layer exists, and which are on one of the source and drain electrodes.

The second region may include an externally extended region of one of the source and drain electrodes connected to the first electrode, and the extended region and the TFT do not overlap with each other.

The second region may include an externally extended region of one of the source and drain electrodes connected to the first electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present invention will be described in detail by explaining exemplary embodiments of the invention with reference to the attached drawings.

As used herein, the term "and/or" includes any and all combinations of one or more of the associated listed items.

Expressions such as "at least one of," when preceding a list of elements, modify the entire list of elements and do not modify the individual elements of the list.

Figure 1:
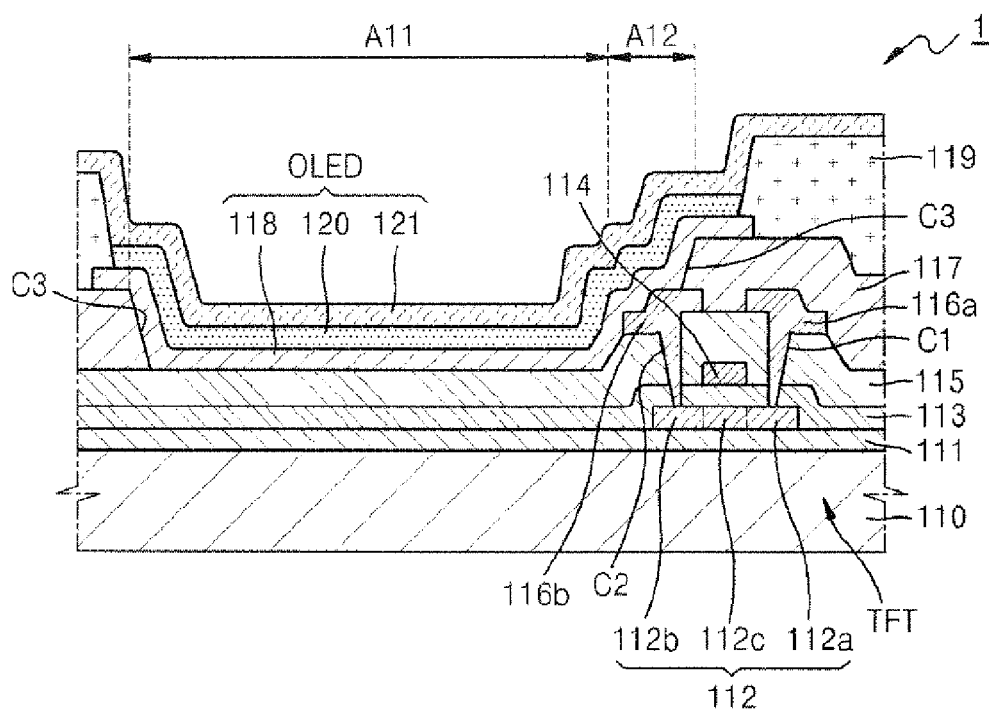
FIG. 1 is a cross-sectional view illustrating a portion of a pixel in an organic light emitting display apparatus according to a first embodiment of the present invention.
Figure 2:
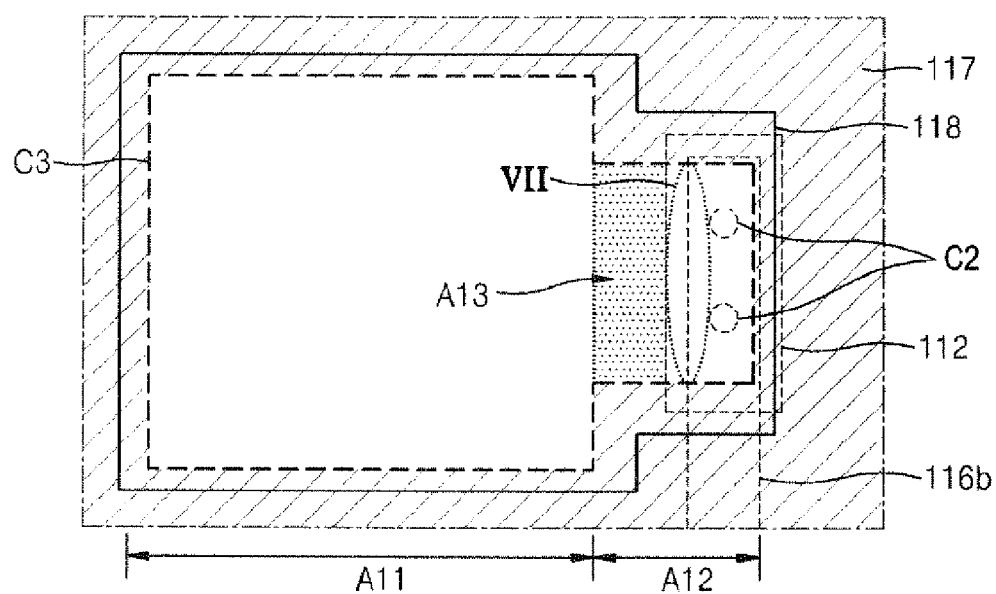
FIG. 2 is a planar view illustrating a relation between a third insulating layer and a first electrode of the organic light emitting display apparatus according to the first embodiment of the present invention.

FIG. 1 is a cross-sectional view illustrating a portion of a pixel in an organic light emitting display apparatus according to a first embodiment of the present invention; and FIG. 2 is a planar view illustrating a relation between a third insulating layer and a first electrode of the organic light emitting display apparatus according to the first embodiment of the present invention.

Referring to FIGS. 1 and 2, a thin film transistor (TFT) and an organic light emitting diode (OLED) are arranged above a substrate 110 in a pixel of the organic light emitting display apparatus 1.

The substrate 110 may be formed as a transparent substrate which may transmit light toward a bottom of the substrate 110, and which includes not only a glass substrate but also a plastic substrate including polyethylen terephthalate (PET), polyethylen naphthalate (PEN), polyimide, and the like.

A buffer layer 111 may be further formed on the substrate 110 so as to obtain smoothness of the substrate 110 and to prevent penetration of foreign materials from the substrate 110. The buffer layer 111 may be a single layer or a composite layer including silicon nitride and/or silicon oxide.

An active layer 112 is formed above the substrate 110. The active layer 112 may be formed of a semiconductor including amorphous silicon or crystalline silicon. The active layer 112 may include a channel region 112c, and a source region 112a and a drain region 112b that are doped with ion impurities in outer sides of the channel region 112c.

A gate electrode 114 is formed above the active layer 112 by having a first insulating layer 113 that is a gate insulating layer interposed therebetween so as to correspond to the channel region 112c of the active layer 112. The gate electrode 114 may be a single layer or a composite layer including at least one of aluminum (Al), platinum (Pt), palladium (Pd), silver (Ag), magnesium (Mg), gold (Au), nickel (Ni), neodymium (Nd), iridium (Ir), chrome (Cr), nickel (Ni), calcium (Ca), molybdenum (Mo), titanium (Ti), tungsten (W), and copper (Cu).

A second insulating layer 115 which is an interlayer insulating layer is formed on the gate electrode 114, and a source electrode 116a and a drain electrode 116b are formed on the second insulating layer 115. The source electrode 116a and the drain electrode 116b are connected to the source region 112a and the drain region 112b, respectively, of the active layer 112 via a first opening C1 and a second opening C2, respectively, that are formed in the second insulating layer 115. As will be described later, the drain electrode 116b directly contacts the first electrode 118 of the OLED without a via hole formed in the third insulating layer 117, and supplies a current to the first electrode 118. Each of the source electrode 116a and the drain electrode 116b may be a single layer or a composite layer including at least one of Al, Pt, Pd, Ag, Mg, Au, Ni, Nd, Ir, Cr, Li, Ca, Mo, Ti, W, and Cu.

The first insulating layer 113 and the second insulating layer 115 may be formed as an inorganic insulating layer. The inorganic insulating layer that forms the first insulating layer 113 and the second insulating layer 115 may include $SiO_2$, $SiN_x$, SiON, $Al_2O_3$, $TiO_2$, $Ta_2O_5$, $HfO_2$, $ZrO_2$, BST, PZT, or the like.

The third insulating layer 117 is formed on the second insulating layer 115. The third insulating layer 117 is opened so as to expose the second insulating layer 115 at a position in which the first electrode 118 of the OLED is formed. This portion is referred to as a first region A11.

In the case of a bottom emission type organic light emitting display apparatus in which an image is realized toward the substrate 110, light emitted from an organic emission layer (organic EML) 120 passes through the first electrode 118, the second insulating layer 115, the first insulating layer 113, and the buffer layer 111, and is then emitted toward the substrate 110. In this process, a color shift may occur at a side-surface viewing angle of the organic light emitting display apparatus 1 due to different optical paths of the plurality of insulating layers 111, 113, and 115 having different refractive indexes. Thus, in the organic light emitting display apparatus 1 according to the present embodiment, the third insulating layer 117, which is in the first region A11 and which is between the first electrode 118 and the second insulating layer 115, is removed and, by doing so, the color shift at the side-surface viewing angle may be minimized.

Also, the third insulating layer 117 is formed on the second insulating layer 115 so as to cover one of the source electrode 116a and the drain electrode 116b and to open the other one. In the present embodiment, the third insulating layer 117 is formed so as to cover the source electrode 116a and to open the drain electrode 116b. Obviously, one or more embodiments of the present invention are not limited thereto, and thus the third insulating layer 117 may be formed so as to open the source electrode 116a and to cover the drain electrode 116b. Hereinafter, a portion of the third insulating layer 117, in which the drain electrode 116b is opened, is referred to as a second region A12.

The TFT of FIG. 1 corresponds to a driving transistor for driving the OLED, and in this regard, the second region A12 is formed in a region in which the driving transistor is disposed, and it is not necessary to form the second region A12 in a region in which a switching transistor (not shown) or a complementary transistor (not shown) is disposed.

The first electrode 118 is formed so as to be connected to the drain electrode 116b and to cover the first region A11 and the second region A12. Because the first electrode 118 is formed of a transparent conductive material, light emitted from the organic EML 120 may travel toward the first electrode 118. The transparent conductive material may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The organic EML 120 may include a small molecule organic material or a polymer organic material. When the organic EML 120 includes the small molecule organic material, a hole transport layer (HTL), a hole injection layer (HIL), an electron transport layer (ETL), and an electron injection layer (EIL) may be stacked with respect to the organic EML 120. Alternatively, various layers may be stacked when required. In this regard, an organic material may include copper phthalocyanine (CuPc), N'-Di(naphthalene-1-yl)-N, N'-diphenyl-benzidine (NPB), tris-8-hydroxyquinoline aluminum ($Alq_3$), or the like. When the organic EML 120 includes the polymer organic material, a HTL may be included, in addition to the organic EML 120. The HTL may be formed of poly-(3,4)-ethylene-dihydroxy thiophene (PEDOT) or polyaniline (PANI). In this regard, an organic material may include a polymer organic material such as a phenylenevinylene (PPV)-based polymer organic material and a polyfluorene-based polymer organic material.

A second electrode 121, which is a common electrode, is formed on the organic EML 120. In the organic light emitting display apparatus 1, the first electrode 118 is used as an anode and the second electrode 121 is used as a cathode. However, polarities of the first and second electrodes 118 and 121, respectively, may be switched.

The second electrode 121 may be formed as a reflective electrode including a reflective material. The second electrode 121 may include at least one material selected from the group consisting of Al, Mg, Li, Ca, LiF/Ca, and LiF/Al. Because the second electrode 121 is formed as the reflective electrode, light emitted from the organic EML 120 is reflected from the second electrode 121, passes through the first electrode 118 formed of the transparent conductive material, and is then emitted toward the substrate 110.

A fourth insulating layer 119 which partially covers an outer surface of the first electrode 118 functions as a pixel defining layer (PDL) between the first electrode 118 and the second electrode 121. The fourth insulating layer 119 may be formed as an organic insulating layer. The fourth insulating layer 119 may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof.

Although not illustrated in FIG. 1, in the organic light emitting display apparatus 1, the first electrode 118 is not only formed of the transparent conductive material but may further include a transflective metal layer including at least one material selected from the group consisting of Ag, an Ag alloy, Al, and an Al alloy. Because the second electrode 121 functions as a reflective mirror, and the first electrode 118 including the transflective metal layer functions as a transflective mirror, the light emitted from the organic EML 120 may resonate between the first electrode 118 and the second electrode 121 so that the luminescent efficiency of light that is emitted toward the substrate 110 may be further improved.

In the present embodiment, the first region A11 and the second region A12 are formed as one opening C3 which is integrally connected to the third insulating layer 117. That is, a via hole (refer to C5 of FIG. 4) to connect the first electrode 118 and the drain electrode 116b is not formed between the first region A11 and the second region A12 of the third insulating layer 117.

In the bottom emission type organic light emitting display apparatus, in order to separately form the via hole in the third insulating layer 117, an emission area is decreased due to a design rule. However, according to the present embodiment, the drain electrode 116b directly contacts the first electrode 118 without the via hole formed in the third insulating layer 117 so that the emission area is extended. Reference numeral A13 of FIG. 2 indicates an emission area that is larger than an emission area of an organic light emitting display apparatus 2 of FIGS. 3 and 4 in which a via hole is separately formed in a third insulating layer 17.

In the second region A12, devices such as a TFT or a capacitor may be disposed between the first electrode 118 and the substrate 110, and in this regard, the devices block light emitted toward the substrate 110 in the bottom emission type organic light emitting display apparatus so that light emission does not occur in a region in which the devices are disposed. FIG. 2 illustrates an example in which the drain electrode 116b and the active layer 112 are disposed in a lower portion of the second region A12, and thus the emission area is not extended in a region in which the drain electrode 116b and the active layer 112 are formed.

Figure 3:
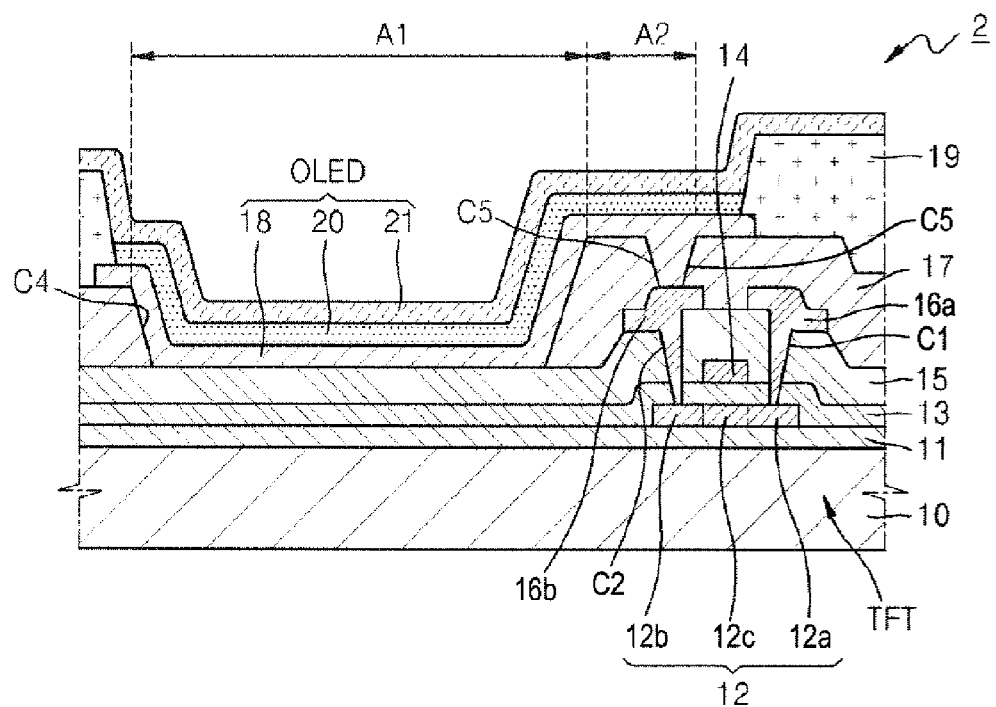
FIG. 3 is a cross-sectional view illustrating a portion of a pixel in an organic light emitting display apparatus according to a comparative example.
Figure 4:
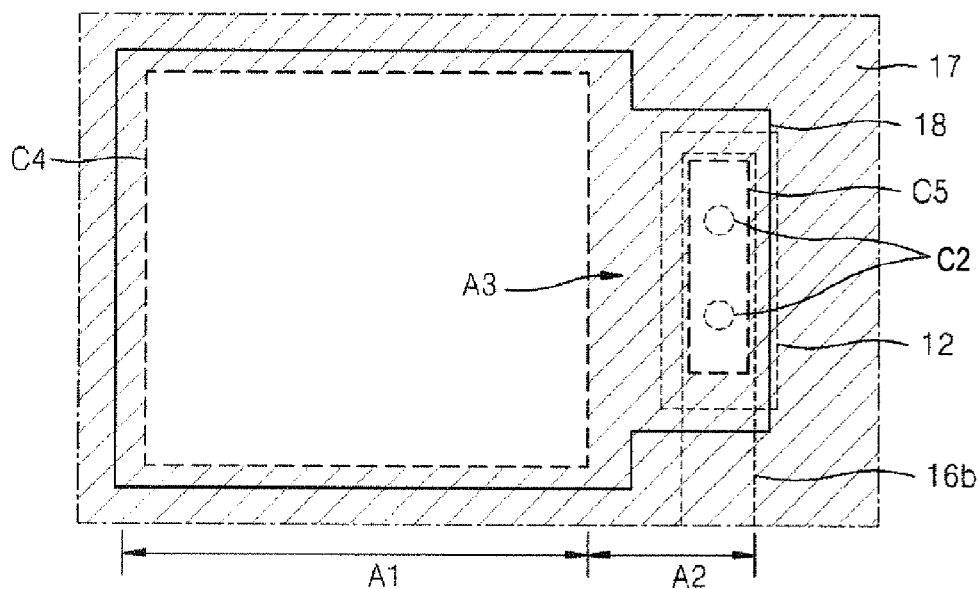
FIG. 4 is a planar view illustrating a relation between a third insulating layer and a first electrode of the organic light emitting display apparatus according to the comparative example.

FIG. 3 is a cross-sectional view illustrating a portion of a pixel in the organic light emitting display apparatus according to a comparative example; and FIG. 4 is a planar view illustrating a relation between the third insulating layer and a first electrode of the organic light emitting display apparatus according to the comparative example.

Referring to FIGS. 3 and 4, a TFT and an OLED are formed on a substrate 10 of a pixel in the organic light emitting display apparatus 2 according to the comparative example.

A buffer layer 11, an active layer 12 including a source region 12a, a drain region 12b, and a channel region 12c, a first insulating layer 13, a gate electrode 14, a second insulating layer 15, a source electrode 16a, and a drain electrode 16b are formed on the substrate 10. The source electrode 16a and the drain electrode 16b are connected to the source region 12a and the drain region 12b, respectively, of the active layer 12 via a first opening C1 and a second opening C2, respectively, which are formed in the second insulating layer 15.

The third insulating layer 17 is formed on the second insulating layer 15. In the third insulating layer 17, a first region A1 in which an opening C4 is formed to expose the second insulating layer 15 in a position of the first electrode 18 of the OLED, and a second region A2 in which an opening C5 is formed to expose the drain electrode 16b, are formed. That is, the opening C4 formed in the first region A1 and the opening C5 formed in the second region A2 are separated from each other.

In the comparative example, a via hole (refer to C5) for connecting the first electrode 18 and the drain electrode 16b is separately formed in the second region A2, and thus it is necessary to form the third insulating layer 17 between the opening C4 in the first region A1 and the opening C5 in the second region A2 (refer to A3). Thus, an emission area is decreased due to a design rule.

In contrast, in the organic light emitting display apparatus 1 according to the first embodiment, the first electrode 118 and the drain electrode 116b are directly connected to each other without a via hole so that the emission area may be extended and an aperture ratio may be increased.

Hereinafter, an organic light emitting display apparatus will now be described with reference to FIG. 5.

Figure 5:
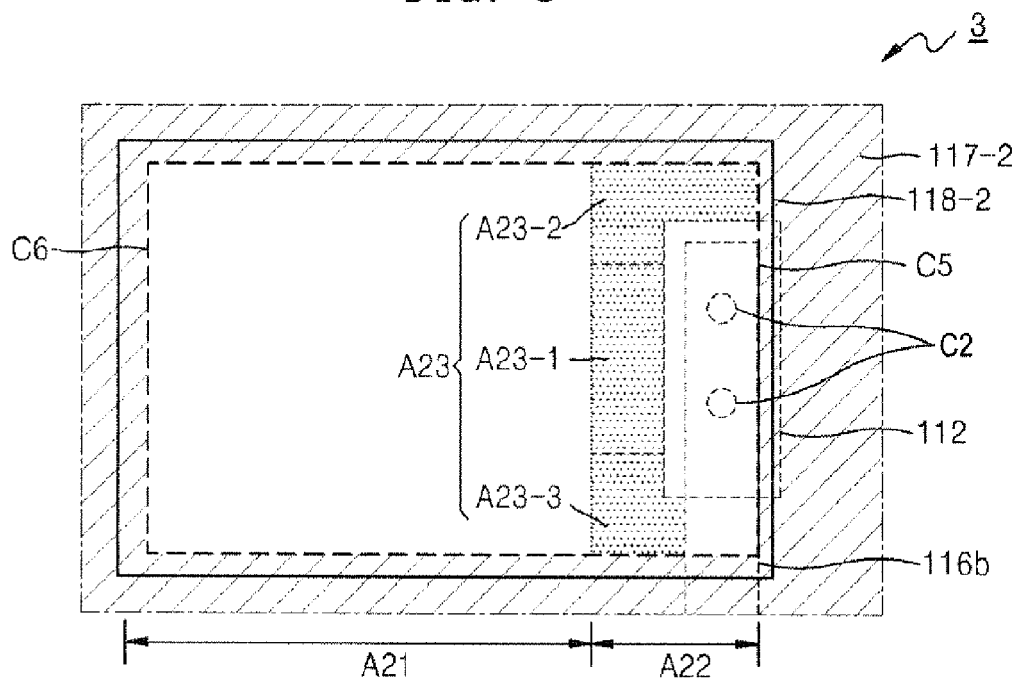
FIG. 5 is a planar view illustrating a relation between a third insulating layer and a first electrode of an organic light emitting display apparatus according to a second embodiment of the present invention.

FIG. 5 is a planar view illustrating a relation between a third insulating layer and a first electrode of the organic light emitting display apparatus according to a second embodiment of the present invention.

Referring to FIG. 5, a first region A21 and a second region A22 are formed as one opening C6 which is integrally connected to the third insulating layer 117-2. That is, a via hole to connect the first electrode 118-2 and a drain electrode 116b is not separately formed between the first region A21 and the second region A22 of the third insulating layer 117-2. Thus, compared to the aforementioned comparative example, the emission area of the second embodiment is extended (refer to A23-1).

The opening C6 formed in the second region A22 is not only formed in the drain electrode 116b of a TFT but also extends to and is formed in an outer portion of the drain electrode 116b (refer to A23-2 and A23-3).

In the organic light emitting display apparatus 2 of FIG. 4 according to the aforementioned comparative example, the third insulating layer 17 is formed between the opening C4 in the first region A1 and the opening C5 in the second region A2 (refer to A3), such that a step difference is incurred in an outer portion of the drain electrode 116b due to the thickness of the third insulating layer 17. Due to the step difference, a step coverage deteriorates so that it is difficult to form the first electrode 18 at a position with the step difference.

However, according to the present embodiment, the third insulating layer 117-2 of FIG. 5 is not formed in the drain electrode 116b and the outer portion of the drain electrode 116b so that a step difference does not occur, and the first electrode 118-2 may also be formed in the outer portion of the drain electrode 116b. Thus, an emission area is further extended to the outer portion of the drain electrode 116b (refer to A23-2 and A23-3). Obviously, devices such as a TFT or a capacitor should not be disposed in a lower portion of the extended emission area (refer to A23-2 and A23-3).

Hereinafter, an organic light emitting display apparatus will now be described with reference to FIG. 6.

Figure 6:
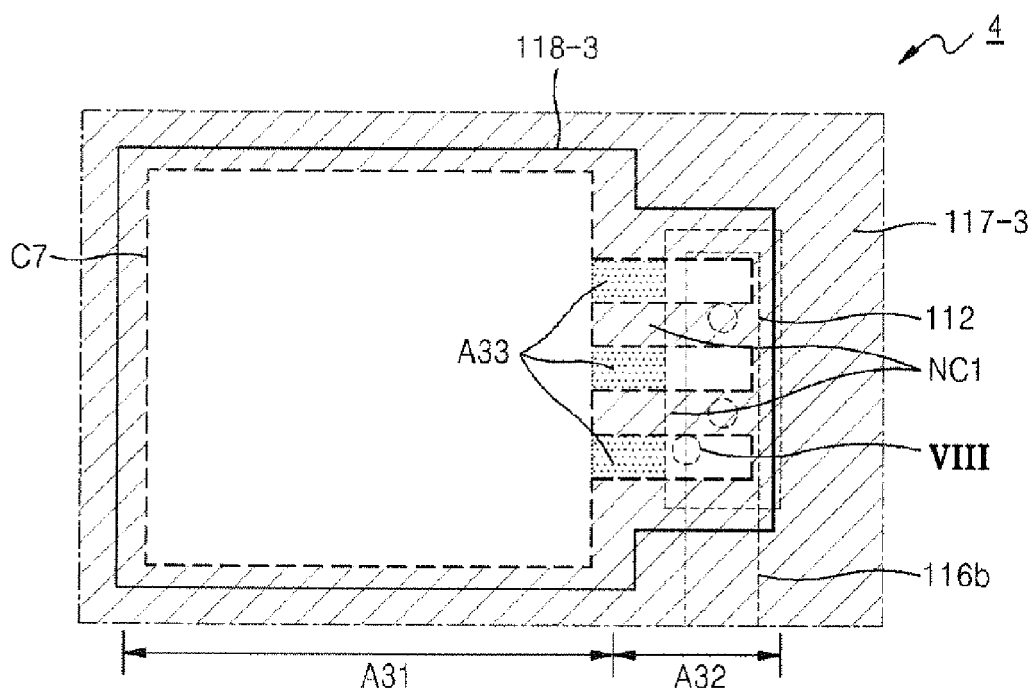
FIG. 6 is a planar view illustrating a relation between a third insulating layer and a first electrode of an organic light emitting display apparatus according to a third embodiment of the present invention.

FIG. 6 is a planar view illustrating a relation between a third insulating layer and a first electrode of the organic light emitting display apparatus according to a third embodiment of the present invention.

Referring to FIG. 6, a first region A31 and a second region A32 are formed as one opening C7 which is integrally connected to the third insulating layer 117-3. That is, a via hole to connect the first electrode 118-3 and a drain electrode 116b is not separately formed between the first region A31 and the second region A32 of the third insulating layer 117-3. Thus, compared to the aforementioned comparative example, the emission area of the third embodiment is extended (refer to A33).

However, in the present embodiment, the opening C7 formed in the second region A32 does not entirely expose the drain electrode 116b of a TFT, and non-openings NC in which the third insulating layer 117-3 exists are formed in a portion of the drain electrode 116b. The non-openings NC may be formed in a repetitive pattern, and in the present embodiment, the non-openings NC are formed in a zigzag pattern. Thus, in the present embodiment, a portion of the drain electrode 116b directly contacts the first electrode 118-3 via the opening C7 without the third insulating layer 117-3, and the rest of the drain electrode 116b is connected to the first electrode 118-3 by having the third insulating layer 117-3 of the non-openings NC interposed therebetween.

Figure 7:
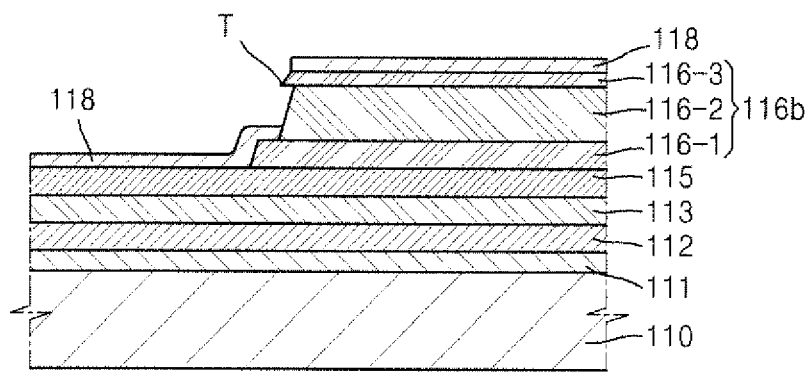
FIG. 7 is a cross-sectional view illustrating a portion VII of FIG. 2.
Figure 8:
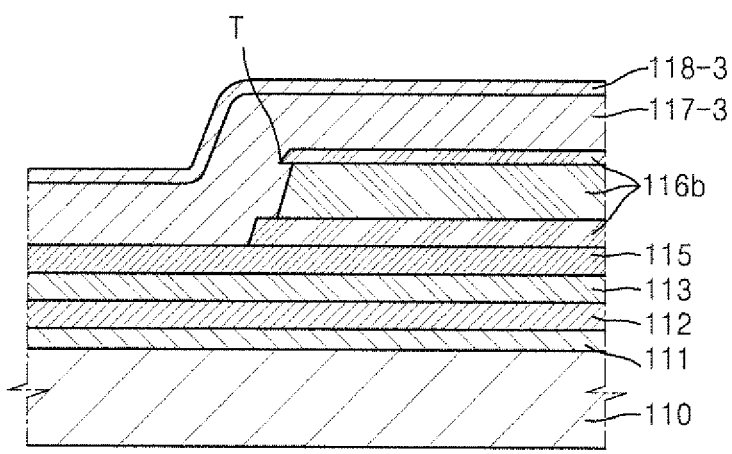
FIG. 8 is a cross-sectional view illustrating a portion VIII of FIG. 6.

FIG. 7 is a cross-sectional view illustrating a portion VII of FIG. 2; and FIG. 8 is a cross-sectional view illustrating a portion VIII of FIG. 6.

The portion VII of FIG. 2 is adjacent to an end of the drain electrode 116b in the second region A12 of the first embodiment, and in the portion VII of FIG. 2, the first electrode 118 and the drain electrode 116b directly contact each other without the third insulating layer 117.

Referring to FIG. 7, the substrate 110, the buffer layer 111, the active layer 112, the first insulating layer 113, and second insulating layer 115 are disposed, and the drain electrode 116b is formed on the second insulating layer 115.

The drain electrode 116b may be formed as a composite layer including materials having different etch rates. For example, a first layer 116-1 of the drain electrode 116b is formed of molybdenum, a second layer 116-2 is formed of aluminum, and a third layer 116-3 is formed of molybdenum. When the drain electrode 116b is etched, due to the different etch rates, an etched surface of the drain electrode 116b may not be smooth but has a projected portion T as shown in FIG. 7. Due to the projected portion T, a short of the first electrode 118 may occur in the end of the drain electrode 116b.

The portion VIII of FIG. 6 is adjacent to an end of the drain electrode 116b of the non-opening NC1 in the second region A32 of the third embodiment, and in the portion VIII, the third insulating layer 117-3 exists between the first electrode 118-3 and the drain electrode 116b.

Referring to FIG. 8, the substrate 110, the buffer layer 111, the active layer 112, and the second insulating layer 115 are formed, and the drain electrode 116b is formed on the second insulating layer 115. The drain electrode 116b may be formed as multiple layers 116-1, 116-2, and 116-3 including materials having different etch rates. Thus, when the drain electrode 116b is etched, due to the different etch rates, an etched surface of the drain electrode 116b may not be smooth but has a projected portion T.

In the present embodiment, the third insulating layer 117-3 is not formed around the drain electrode 116b in which the opening C7 of FIG. 6 is formed, and thus, due to the projected portion T, a short of the first electrode 118-3 may occur in the end of the drain electrode 116b. However, in the non-opening NC1 of FIG. 6, the third insulating layer 117-3 is formed between the drain electrode 116b and the first electrode 118-3, and thus, the short of the first electrode 118-3 due to the projected portion T does not occur. Therefore, compared to the first embodiment, a current may be stably supplied from the drain electrode 116b to the first electrode 118-3.

Hereinafter, an organic light emitting display apparatus will now be described with reference to FIG. 9.

Figure 9:
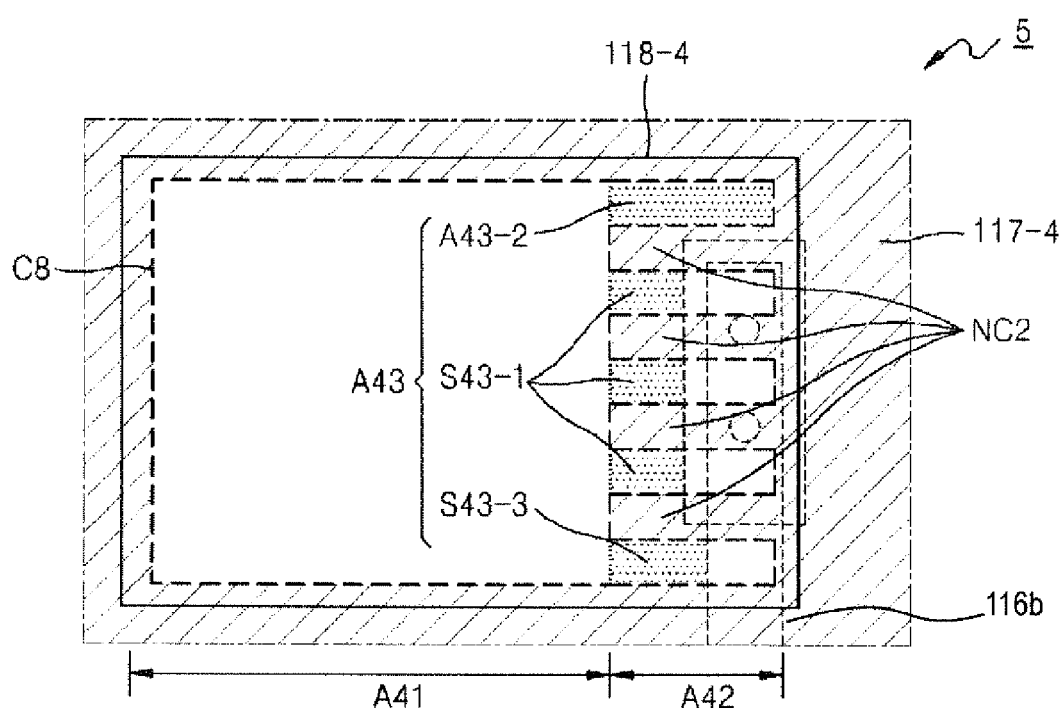
FIG. 9 is a planar view illustrating a relation between a third insulating layer and a first electrode of an organic light emitting display apparatus according to a fourth embodiment of the present invention.

FIG. 9 is a planar view illustrating a relation between a third insulating layer and a first electrode of the organic light emitting display apparatus according to a fourth embodiment of the present invention.

Referring to FIG. 9, a first region A41 and a second region A42 are formed as one opening C8 that is integrally connected to the third insulating layer 117-4. That is, a via hole to connect the first electrode 118-4 and a drain electrode 116b is not separately formed between the first region A41 and the second region A42 of the third insulating layer 117-4. Thus, compared to the aforementioned comparative example, the emission area of the fourth embodiment is extended (refer to A43-1).

Also, in the present embodiment, the opening C8 formed in the second region A42 does not entirely expose the drain electrode 116b of a TFT, and non-openings NC2 in which the third insulating layer 117-4 exists are formed in a portion of the drain electrode 116b. Thus, in the present embodiment, a portion of the drain electrode 116b directly contacts the first electrode 118-4 via the opening C8 without the third insulating layer 117-4, and the rest of the drain electrode 116b is connected to the first electrode 118-4 by having the third insulating layer 117-4 of the non-openings NC2 interposed therebetween. Therefore, similar to the aforementioned third embodiment, a short of the first electrode 118-4 does not occur in the non-openings NC2, so that a current may be stably supplied from the drain electrode 116b to the first electrode 118-4.

Also, in the present embodiment, the opening C8 formed in the second region A42 is not only formed in the drain electrode 116b of the TFT but also extends to and is formed in an outer portion of the drain electrode 116b (refer to A43-2 and A43-3). Thus, according to the present embodiment, the third insulating layer 117-4 is not formed in the drain electrode 116b and the outer portion of the drain electrode 116b, except for the non-openings NC2, so that the first electrode 118-4 may be formed in the outer portion of the drain electrode 116b. Thus, an emission area is further extended to the outer portion of the drain electrode 116b (refer to A43-2 and A43-3).

Although not illustrated, the organic light emitting display apparatus according to the one or more embodiments of the present invention may further include an encapsulating member (not shown) for encapsulating the OLED. The encapsulating member may be formed of a substrate including a glass material, and an encapsulation thin film formed of a metal film or an organic insulating layer and an inorganic insulating layer that are alternately disposed.

The substrate including TFTs and the organic light emitting display apparatus including the substrate according to the one or more embodiments of the present invention provide effects as below.

First, a pixel electrode, and a connection electrode of the TFT are directly connected to each other without a via hole so that the emission area may be extended and the aperture ratio may be increased.

Second, non-openings having an insulating layer formed thereon are formed between the pixel electrode and the connection electrode of the TFT so that a current may be stably supplied to the pixel electrode.

Third, the opening extends to an outer portion of the connection electrode of the TFT so that the aperture ratio may be increased.

Fourth, an insulating layer in which the opening is formed in a lower portion of the pixel electrode is removed so that a color shift at a side-surface viewing angle may be decreased.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A substrate, comprising:
   a thin film transistor (TFT) including an active layer, a gate electrode, a source electrode, and a drain electrode;
   a first insulating layer disposed between the active layer and the gate electrode;
   a second insulating layer disposed between the gate electrode and the source and drain electrodes;
   a third insulating layer disposed on the second insulating layer, and including an integrally formed hole which exposes the second insulating layer in a first region and which exposes one of the source and drain electrodes in a second region; and
   a first electrode connected to one of the source and drain electrodes, disposed to cover the first region and the second region, and directly contacting the second insulating layer exposed by the integrally formed hole in the first region,
   a portion of the third insulating layer interposed between the first electrode and the second insulating layer.

2. The substrate of claim 1, wherein the first electrode comprises a transparent conductive oxide.

3. The substrate of claim 2, wherein the transparent conductive oxide comprises at least one material selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

4. The substrate of claim 1, wherein the source and drain electrodes comprise a plurality of metal layers, edges of at least two immediately adjacent metal layers not overlapping each other in a direction perpendicular to the substrate.

5. The substrate of claim 1, wherein the second region further comprises non-openings in which the third insulating layer exists, and which are on one of the source and drain electrodes.

6. The substrate of claim 5, wherein the non-openings are disposed in a repetitive pattern.

7. The substrate of claim 5, wherein the first electrode is disposed on the third insulating layer of the non-openings.

8. The substrate of claim 5, wherein the second region comprises an externally extended region of one of the source and drain electrodes connected to the first electrode, and the extended region and the TFT do not overlap each other.

9. The substrate of claim 1, wherein the second region comprises an externally extended region of one of the source and drain electrodes connected to the first electrode.

10. The substrate of claim 9, wherein the extended region and the TFT do not overlap each other.

11. The substrate of claim 9, wherein the third insulating layer is not disposed in the extended region.

12. The substrate of claim 9, wherein the first electrode is disposed in the extended region.

13. The substrate of claim 1, wherein the first electrode further comprises a transflective metal layer.

14. The substrate of claim 13, wherein the transflective metal layer comprises at least one material selected from a group consisting of Ag, an Ag alloy, Al, and an Al alloy.

15. An organic light emitting display apparatus, comprising:
   a thin film transistor (TFT) including an active layer, a gate electrode, a source electrode, and a drain electrode;

a first insulating layer disposed between the active layer and the gate electrode;

a second insulating layer disposed between the gate electrode and the source and drain electrodes;

a third insulating layer disposed on the second insulating layer, and including an integrally formed hole which exposes the second insulating layer in a first region and which exposes one of the source and drain electrodes in a second region; and a first electrode connected to one of the source and drain electrodes, disposed to cover the first region and the second region, and directly contacting the second insulating layer exposed by the integrally formed hole in the first region;

a second electrode facing the first electrode; and an organic emission layer (organic EML) disposed between the first electrode and the second electrode, a portion of the third insulating layer interposed between the first electrode and the second insulating layer.

16. The organic light emitting display apparatus of claim 15, wherein the first electrode comprises a transparent conductive oxide, and the second electrode is a reflective electrode that reflects light emitted from the organic EML.

17. The organic light emitting display apparatus of claim 16, wherein the first electrode further comprises a transflective metal layer.

18. The organic light emitting display apparatus of claim 15, wherein the second region comprises non-openings in which the third insulating layer exists and which are on one of the source and drain electrodes.

19. The organic light emitting display apparatus of claim 18, wherein the second region comprises an externally extended region of one of the source and drain electrodes connected to the first electrode, and the extended region and the TFT do not overlap each other.

20. The organic light emitting display apparatus of claim 15, wherein the second region comprises an externally extended region of one of the source and drain electrodes connected to the first electrode.

* * * * *